(12) United States Patent
Cha et al.

(10) Patent No.: US 8,999,099 B2
(45) Date of Patent: Apr. 7, 2015

(54) SUBSTRATE BONDING SYSTEM AND MOBILE CHAMBER USED THERETO

(75) Inventors: Yong-Won Cha, Seoul (KR); Sang Wook Yoo, Gyeonggi-do (KR); Gun-Woo Park, Gyeongii-do (KR); Seung-Hee Jung, Gyeonggi-do (KR)

(73) Assignee: Ltrin. Co., Ltd., Gyeonggi-Do (KR)

( * ) Notice: Subject to any disclaimer, the term of this patent is extended or adjusted under 35 U.S.C. 154(b) by 291 days.

(21) Appl. No.: 13/577,458
(22) PCT Filed: Nov. 26, 2010
(86) PCT No.: PCT/KR2010/008461
§ 371 (c)(1), (2), (4) Date: Aug. 7, 2012
(87) PCT Pub. No.: WO2011/096638
PCT Pub. Date: Aug. 11, 2011

(65) Prior Publication Data
US 2012/0298306 A1  Nov. 29, 2012

(30) Foreign Application Priority Data
Feb. 8, 2010 (KR) .................. 10-2010-0011642

(51) Int. Cl.
*B29C 65/00* (2006.01)
*B32B 37/00* (2006.01)
(Continued)

(52) U.S. Cl.
CPC ...... *H01L 21/6776* (2013.01); *H01L 21/67092* (2013.01); *H01L 21/6719* (2013.01)

(58) Field of Classification Search
CPC ........ B29C 65/00; B29C 65/02; B29C 65/04; B29C 65/14; B29C 65/1403; B29C 65/1425; B29C 65/245; B29C 65/78; B29C 65/7802; B29C 65/7841; B29C 65/7847; B29C 65/7861; B29C 65/787; B29C 65/7876; B29C 66/00; B29C 66/001; B29C 66/00145; B32B 37/00; B32B 37/06; B32B 37/10; B32B 37/1009; B32B 37/1018; B32B 38/0008; B32B 38/18; B32B 38/1808; B32B 38/1833; B65H 5/00; B65H 5/02; B65H 29/005
USPC .......................................... 156/285, 286, 382
See application file for complete search history.

(56) References Cited

U.S. PATENT DOCUMENTS 2,464,540 A * 3/1949 Williams, Jr. ................. 156/104
5,292,388 A * 3/1994 Candore ......................... 156/64
(Continued)

FOREIGN PATENT DOCUMENTS

| JP | 05-190406 | 7/1993 |
| JP | 2004-153159 | 5/2004 |

(Continued)

*Primary Examiner* — Richard Crispino
*Assistant Examiner* — Matthew Hoover
(74) *Attorney, Agent, or Firm* — Stuart H. Mayer; Mayer & Williams PC

(57) ABSTRACT

A substrate attachment system, including a portable chamber for receiving a pair of substrates which are aligned; a conveyor transportation device which continuously moves the portable chamber and to which a vacuum generator that is connected to a vacuum port of the portable chamber to evacuate the inside of the portable chamber is provided; and a heating device for performing a heating process in which the aligned substrates are attached to each other in the portable chamber, wherein the conveyor transportation device is arranged to pass through the heating device. The substrate attachment system may contribute to high attachment accuracy, and also, since the size of a chamber is reduced, a spatial utilization rate may be high, and also, since an attachment process is continuously performed by using a conveyor transportation device, a process time may be reduced.

5 Claims, 2 Drawing Sheets

(51) Int. Cl.
*H01L 21/677* (2006.01)
*H01L 21/67* (2006.01)

(56) References Cited

U.S. PATENT DOCUMENTS 6,432,240 B1 * 8/2002 Balduin et al. ................ 156/106

2006/0144522 A1 * 7/2006 Sklyarevich et al. ......... 156/382

FOREIGN PATENT DOCUMENTS

JP 2008-027930 7/2008
KR 1020080052645 11/2008

* cited by examiner

SUBSTRATE BONDING SYSTEM AND MOBILE CHAMBER USED THERETO

TECHNICAL FIELD

The present invention relates to a substrate attachment system, and in particular, to a substrate attachment system for increasing a production yield of attached substrates per time.

BACKGROUND ART

In fabricating a semiconductor device, in some cases, a process for attaching two or more devices is required. An example of such a process that requires a process for attaching two or more devices is a process for manufacturing a silicon-on-insulator (SOI) substrate, or a process for forming a stack-type semiconductor device for improving a degree of integration. These processes require a process for attaching two or more devices, for example, attaching substrates to each other by using an adhesive, or directly attaching substrates by using a eutectic characteristic arising due to the diffusion between metal layers that constitute the substrates, without use of an adhesive. Regarding the method of attaching substrates by using an adhesive, an organic or inorganic adhesive layer is formed on a surface of a substrate, and then, the substrate is attached to another substrate due to an adhesive force of the adhesive, and regarding the direct-attaching, pressure is applied to substrates at a temperature that is equal to or higher than a eutectic point of the substrates to attach the substrates to each other.

From among the attaching methods, according to the latter method, as illustrated in FIG. 1A, substrates are taken away from cassettes ($C_1$, $C_2$, $C_3$, through $C_n$) by using a robot (R), and then, to-be-attached substrates are pre-aligned in a pre-aligning device (P.A), and then, a pair of substrates are accurately aligned in chambers ($CH_1$, $CH_2$, $CH_3$, through $CH_n$) and pressure is applied thereto at a temperature that is equal to or higher than a eutectic point to attach the substrates to each other. However, when substrates are independently attached in the respective chambers ($CH_1$, $CH_2$, $CH_3$, through $CH_n$), since the attaching process is intermittently performed, a time for attaching several substrates is long. In addition, as illustrated in FIG. 1B, when several pairs of substrates are placed in a single chamber (CH) and the attaching process is simultaneously performed thereon, a process time is relatively reduced. However, the attaching process performed in the chamber (CH) has a substantially low degree of accuracy. In addition, when the size of the chamber (CH) is increased to perform the substrate attaching process with high accuracy, a chamber occupies a relatively large space and corresponding installation and maintenance costs substantially increase compared to the manufacturing efficiency of the attached substrates.

DETAILED DESCRIPTION OF THE INVENTION

Technical Problem

The present invention provides a substrate attachment system including: a portable chamber for receiving a pair of substrates which are aligned; a conveyor transportation device which continuously moves the portable chamber and to which a vacuum generator that is connected to a vacuum port of the portable chamber to evacuate the inside of the portable chamber is provided; and a heating device for performing a heating process in which the aligned substrates are attached to each other in the portable chamber, wherein the conveyor transportation device is arranged to pass through the heating device.

The present invention also provides a portable chamber used in the substrate attachment system, wherein the portable chamber includes: a lower chamber portion for placing the aligned substrates; an upper chamber portion that is coupled to the lower chamber portion to form a receiving unit for housing the substrates; and a presser provided to the upper chamber portion to press the substrates, wherein the upper chamber portion or the lower chamber portion comprises a vacuum port for evacuating the receiving unit.

Advantageous Effects

According to the present invention, an attachment process is continuously performed by using a conveyor transportation device, and thus, a production efficiency of the attachment process substantially increases. In addition, a chamber in which the attachment process is performed is miniaturized, thereby obtaining ease of spatial utilization and low manufacturing costs.

EXPLANATION OF REFERENCE NUMERALS DESIGNATING THE MAJOR ELEMENTS OF THE DRAWINGS

Figure 1:
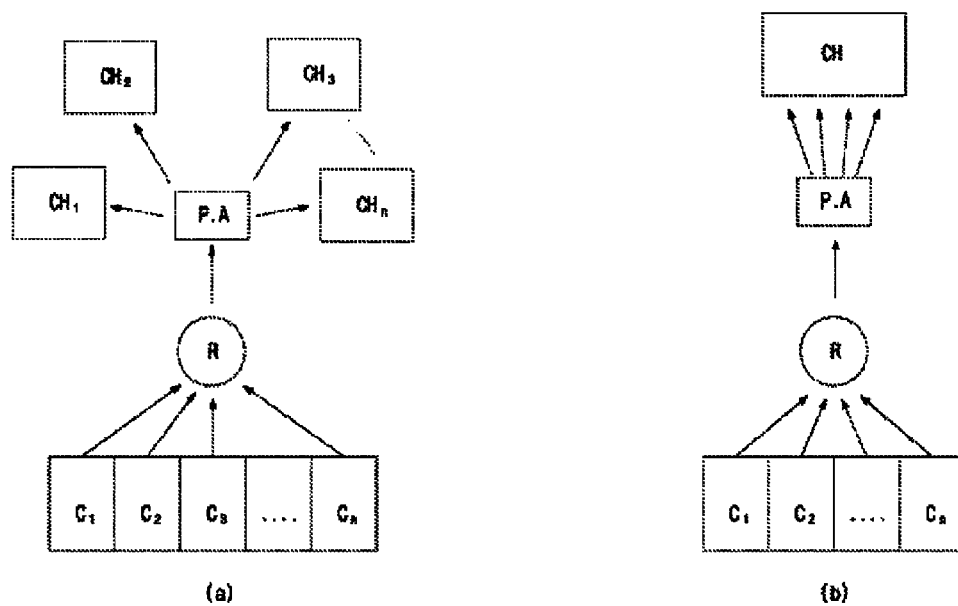
FIG. 1 is a schematic view of a conventional substrate attachment system.

| | |
|---|---|
| 10a: first substrate | 10b: second substrate |
| 110: substrate aligning device | 120: portable chamber |
| 122: lower chamber portion | 122a, 124a: power unit |
| 122b: guider | 122e, 124e: heating unit |
| 124: upper chamber portion | 124b: vacuum port |
| 124c: presser | 124d: receiving unit |
| 129: coupling member | 130: conveyor transportation device |
| 135: guiding unit | 140: heating device |
| 150: vacuum generator | S: spacer |

BEST MODE

According to an embodiment of a substrate attachment system, a heating member for supplying heat to the substrates may be provided to the portable chamber, and a power supplier for applying power to the portable chamber passing through the inside of the heating device may be provided to the heating device.

In addition, the heating device may heat the portable chamber located therein.

In addition, the heating device may heat the substrates by supplying a microwave or a radio frequency thereto.

In addition, the conveyor transportation device may further include a guiding unit for guiding a location of the portable chamber.

At least one of the upper chamber portion and the lower chamber portion may include a heating member.

The heating member may include a heating unit for heating the substrates, and a power unit for transmitting power applied from the outside to the heating unit.

In addition, a coupling member for opening or closing the upper chamber portion and the lower chamber portion, may be further located on a side of the portable chamber.

In addition, the portable chamber may further include a guider for maintaining an alignment state of the aligned substrates located in the lower chamber portion.

MODE OF THE INVENTION

Hereinafter, embodiments of the present invention are described in detail.

A substrate attachment system according to an embodiment of the present invention includes a portable chamber 120 for receiving a pair of substrates 10a and 10b which are aligned;

a conveyor transportation device 130 which continuously moves the portable chamber 120 and to which a vacuum generator 150 that is connected to a vacuum port 124b of the portable chamber 120 to evacuate the inside of the portable chamber 120 is provided; and a heating device 140 for performing a heating process in which the aligned substrates 10a and 10b are attached to each other in the portable chamber 120, wherein the conveyor transportation device 130 is arranged to pass through the heating device 140.

Hereinafter, the present invention is described in detail with reference to embodiments. However, the embodiments are provided to describe the present invention in detail and do not limit the scope of the present invention. This is obvious to one of ordinary skill in the art.

Regarding embodiments, structures, and functions or operations thereof that are known in the art are not described herein.

Figure 2:
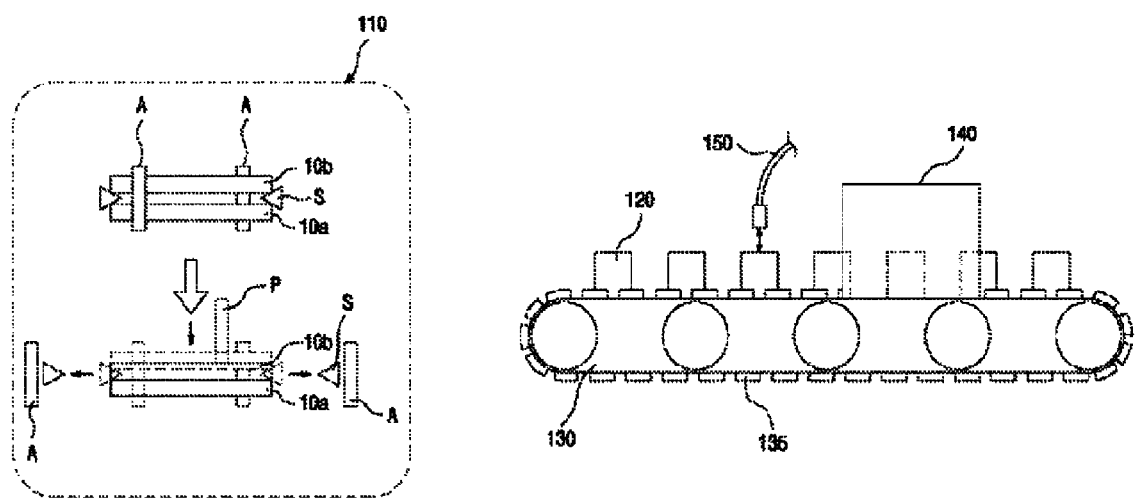
FIG. 2 is a schematic view of a substrate attachment system according to an embodiment of the present invention.

FIG. 2 is a schematic view of a substrate attachment system according to an embodiment of the present invention.

First and second substrates 10a and 10b that are aligned may be supplied to the portable chamber 120. Referring to FIG. 2, the first substrate 10a is loaded to a substrate aligning device 110, and a spacer s moves in a direction from the outside to the inside of the first substrate 10a. The spacer s is vertically located where a portion of the spacer s and an end of the first substrate 10a overlap. Subsequently, the second substrate 10b is loaded above the first substrate 10a, and in this case, the second substrate 10b is spaced apart from the first substrate 10a. The second substrate 10b is loaded in such a way that a corner of the second substrate 10b contacts a surface of an upper portion of the spacer s and the second substrate 10b is spaced apart from the first substrate 10a. In this regard, an aligner A located outside the first substrate 10a and the second substrate 10b moves toward the inside of the first and second substrates 10a and 10b, pressing side surfaces of the first and second substrates 10a and 10b to align the first and second substrates 10a and 10b. Thereafter, the spacer s and the aligner A are retrieved. By doing so, due to the weight of the second substrate 10b itself, the second substrate 10b is placed on the first substrate 10a. In this regard, a pointer P may be provided to the second substrate 10b to maintain the alignment state. The aligned first and second substrates 10a and 10b are located inside the portable chamber 120, and the portable chamber 120 passes through the inside of the heating device 140 along the conveyor transportation device 130.

Attaching the first and second substrates 10a and 10b to each other requires evacuating the inside of the portable chamber 120, and pressing and heating the substrates 10a and 10b.

Accordingly, according to an embodiment of the present invention, a vacuum generator 150 that is connected to the vacuum port 124b of the portable chamber 120 to evacuate the inside of the portable chamber 120, is provided to the conveyor transportation device 130 of the substrate attachment system. That is, while the position of the portable chamber 120 is shifted along the conveyor transportation device 130, the portable chamber 120 reaches the vacuum generator 150, and the vacuum generator 150 is connected to a vacuum port 124b of the portable chamber 120 to evacuate the inside of the portable chamber 120. The vacuum generator 150 is located ahead of the heating device 140 in a progressing direction of the conveyor transportation device 130. By doing so, the portable chamber 120 is evacuated, and then, the substrates 10a and 10b are heated.

The heating process for attaching the first and second substrates 10a and 10b to each other may be performed in various manners.

According to an embodiment of the heating process, a heating member that supplies heat to the first and second substrates 10a and 10b when power is applied, is provided to the portable chamber 120, and then, a power supplier that applies power to the portable chamber 120 passing the inside thereof, is provided to the heating device 140, thereby allowing the heating process for attaching the substrates 10a and 10b to each other to be performed. That is, the heating device 140 does not generate heat and applies power to the portable chamber 120. Accordingly, the portable chamber 120 directly heats the substrates 10a and 10b located therein via power applied by the heating device 140.

According to another embodiment of the heating process, the heating device 140 is formed to have such a structure that applies heat to the portable chamber 120 located therein to perform the heating process for attaching the substrates 10a and 10b to each other. That is, a device for heating the substrates 10a and 10b is not provided to the portable chamber 120, and the heating device 140 has such a device for heating, so that the substrates 10a and 10b are indirectly heated.

The latter method of heating the substrates 10a and 10b inside the heating device 140 may be performed by, in addition to the resistance heating described above, providing a microwave or radio frequency.

That is, a microwave generator or a wireless frequency generator is provided to the inside of the heating device 140, so that when a mini chamber passes through the heating device, a microwave or radio frequency is generated, and then, applied to substrates placed in the mini chamber to heat the substrates.

In particular, when the first and second substrates 10a and 10b are heated by using a radio frequency RF, the first and second substrates 10a and 10b are uniformly heated regardless of their locations. Accordingly, each of the first and second substrates 10a and 10b may have a uniform melting degree. In addition, by setting a range of the radio frequency RF to be a resonant frequency range of each of the first and second substrates 10a and 10b, the first and second substrates 10a and 10b may be heated according to individual characteristics.

When the portable chamber 120 is placed on the conveyor transportation device 130, a side surface of the portable chamber 120 may have a uniform horizontal direction position. That is, when the vacuum generator 150 is connected to evacuate the inside of the portable chamber 120, or when the portable chamber 120 is supplied with power or directly supplied with heat while the portable chamber 120 passes the heating device 140, the uniform horizontal direction position of the portable chamber 120 may allow a plurality of the portable chambers 120 to be subjected to a uniform attachment process, and thus, substrates may have a uniform attachment state. To do this, according to an embodiment of the present invention, the conveyor transportation device 130 may further include a guiding unit 135 for guiding the location of the portable chamber 120.

Figure 3:
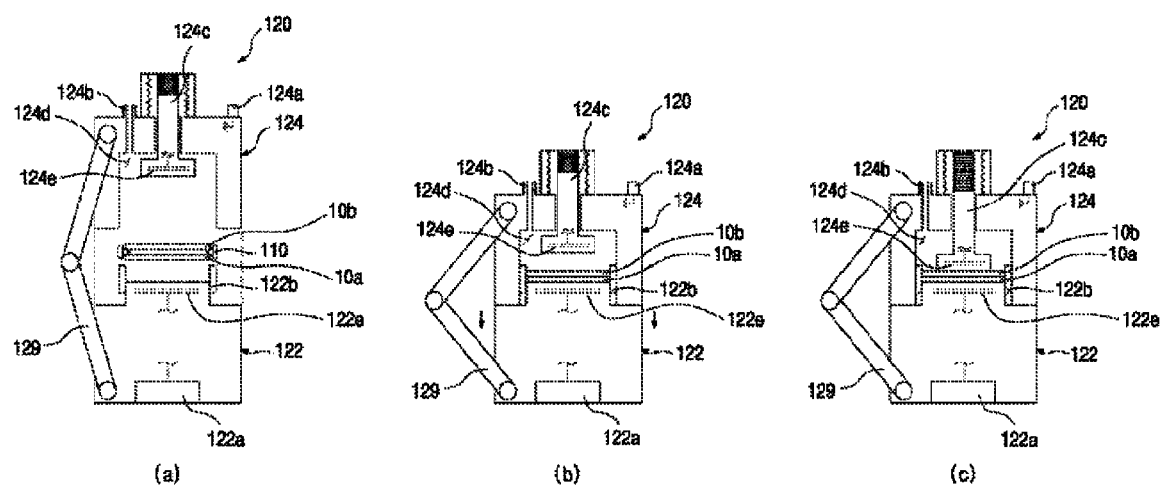
FIG. 3 is a schematic view of a portable chamber according to an embodiment of the present invention.

FIG. 3 is a schematic view of the portable chamber 120 according to an embodiment of the present invention.

The portable chamber 120 according to the present embodiment is used in the substrate attachment system, and includes:

a lower chamber portion 122 for placing the aligned first and second substrates 10a and 10b;

an upper chamber portion 124 that is coupled to the lower chamber portion 122 to form a receiving unit 124d for housing the first and second substrates 10a and 10b; and a presser 124c is provided to the upper chamber portion 124 to apply press on the first and second substrates 10a and 10b, wherein the vacuum port 124b for evacuating the receiving unit 124d may be provided to the upper chamber portion 124 or the lower chamber portion 122. In this regard, the vacuum port 124b evacuates the inside of the portable chamber 120 by connection with the vacuum generator 150 of the conveyor transportation device 130.

According to an embodiment of the present invention, the lower chamber portion 122 may further include a guider 122b for maintaining the alignment state of the aligned first and second substrates 10a and 10b. The guider 122b may limit positions of side surfaces of the first and second substrates 10a and 10b, so that when the first and second substrates 10a and 10b that are pre-aligned by the substrate aligning device 110 are placed on the lower chamber portion 122, the first and second substrates 10a and 10b are placed while the alignment state is maintained constant.

In addition, a coupling member 129 for opening or closing the upper chamber portion 124 and the lower chamber portion 122 may be provided on a side of the portable chamber 120. The coupling member 129 may be, as illustrated in FIG. 3, connected to a side of the portable chamber 120 to enable the opening or closing of the upper chamber portion 124 and the lower chamber portion, and may include a device passing through the upper chamber portion 124 and the lower chamber portion to adjust the opening or closing of the portable chamber 120. However, the opening or closing method of the portable chamber 120 is not limited thereto, and any device that may seal the inside of the portable chamber 120 may be used herein.

When the portable chamber 120 is supplied with power from the heating device 140 and directly heats the substrates 10a and 10b, the upper chamber portion 124 and the lower chamber portion 122 may include a heating member. In this regard, the heating member may include heating units 122e and 124e for heating the first and second substrates 10a and 10b, and power units 122a and 124a for transmitting power applied from the outside to the heating units 122e and 124e. That is, as illustrated in FIG. 3, the lower chamber portion 122 and the upper chamber portion 124 include the power units 122a and 124a and the heating units 122e and 124e, respectively.

The pressing by the presser 124c may be embodied by, for example, flowing-in or out air toward or out of bellows, or using a restoring force of a spring or a motor.

The first and second substrates 10a and 10b may be attached to each other via the portable chamber 120 as follows.

First, when the upper chamber portion 124 and the lower chamber portion of the portable chamber 120 are opened by the coupling member 129, the first and second substrates 10a and 10b aligned by the substrate aligning device 110 are placed in the lower chamber portion 122. The alignment state of the first and second substrates 10a and 10b is maintained by the guider 122b. The upper chamber portion 124 and the lower chamber portion 122 are coupled to each other by the coupling member 129, thereby sealing the portable chamber 120. Once the portable chamber 120 is sealed, the receiving unit 124d becomes in a vacuum state by the vacuum port 124b. After the receiving unit 124d becomes in a vacuum state, the first and second substrates 10a and 10b are pressed by the presser 124c provided to the upper chamber portion 124. Following the pressing of the presser 124c, when power is applied to the power unit 124a of the upper chamber portion 124 and the power unit 122a of the lower chamber portion 122, the heating unit 124e of the upper chamber portion 124 and the heating unit 122e of the lower chamber portion 122, which are respectively, electrically connected to the power units 122a and 124a, are heated to attach the first and second substrates 10a and 10b to each other. The heating temperature of the heating units 122e and 124e may be variable according to purpose, and may be, for example, a eutectic point of the first substrate 10a and the second substrate 10b. For example, facing surfaces of the first substrate 10a and the second substrate 10b which are to be attached to each other, may be formed by depositing all metals that cause an eutectic phenomenon, such as gold and silicon, or gold and tin. For example, when gold and silicon are respectively deposited on the first and second substrates 10a and 10b, the heating units 122e and 124e may heat the first and second substrates 10a and 10b at a temperature at which a contact portion of gold and silicon simultaneously melt and are mixed to be integrally attached to each other.

The locations of the heating units 122e and 124e are not limited, and for example, the heating unit 122e may be located where the substrates 10a and 10b are placed, and the heating unit 124e may be located on the presser 124c.

Any modification or change of the present invention may be obvious to one of ordinary skill in the art, and may be considered being included in the scope of the present invention.

The invention claimed is:

1. A substrate attachment system comprising:
a portable chamber for receiving a pair of substrates which are aligned;
a conveyor transportation device which continuously moves the portable chamber and to which a vacuum generator that is connected to a vacuum port of the portable chamber to evacuate the inside of the portable chamber is provided; and
a heating device for performing a heating process in which the aligned substrates are attached to each other in the portable chamber,
wherein the conveyor transportation device is arranged to pass through the heating device.

2. The substrate attachment system of claim 1, wherein
a heating member for supplying heat to the substrates is provided to the portable chamber, and
a power supplier for applying power to the portable chamber passing through the inside of the heating device is provided to the heating device.

3. The substrate attachment system of claim 1, wherein the heating device heats the portable chamber located therein.

4. The substrate attachment system of claim 1, wherein the heating device heats the substrates by supplying a microwave or a radio frequency thereto.

5. The substrate attachment system of claim 1, wherein the conveyor transportation device further comprises a guiding unit for guiding a location of the portable chamber.

* * * * *